(12) United States Patent
Itoh

(10) Patent No.: US 10,587,264 B2
(45) Date of Patent: Mar. 10, 2020

(54) CAPACITIVE SWITCH DEVICE

(71) Applicant: DENSO CORPORATION, Kariya, Aichi-pref. (JP)

(72) Inventor: Masahiro Itoh, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 58 days.

(21) Appl. No.: 15/571,983

(22) PCT Filed: Apr. 19, 2016

(86) PCT No.: PCT/JP2016/002096
§ 371 (c)(1),
(2) Date: Nov. 6, 2017

(87) PCT Pub. No.: WO2016/185669
PCT Pub. Date: Nov. 24, 2016

(65) Prior Publication Data
US 2018/0145688 A1 May 24, 2018

(30) Foreign Application Priority Data
May 19, 2015 (JP) ................................ 2015-102039

(51) Int. Cl.
*H03K 17/96* (2006.01)

(52) U.S. Cl.
CPC ....... *H03K 17/962* (2013.01); *H03K 17/9622* (2013.01); *H03K 2217/96079* (2013.01); *H03K 2217/960755* (2013.01)

(58) Field of Classification Search
CPC ............. H03K 17/962; H03K 17/9622; H03K 2217/960755; H03K 2217/96079
(Continued)

(56) References Cited

U.S. PATENT DOCUMENTS 7,297,887 B2 * 11/2007 Matsumoto ............. G06F 3/045
200/314
2009/0090605 A1 * 4/2009 Arione ................. H03K 17/962
200/314
(Continued)

FOREIGN PATENT DOCUMENTS

JP 2005008874 A 1/2005
JP 2008141329 A 6/2008
(Continued)

*Primary Examiner* — Edwin A. Leon
*Assistant Examiner* — Lheiren Mae A Caroc
(74) *Attorney, Agent, or Firm* — Harness, Dickey & Pierce, P.L.C.

(57) ABSTRACT

A capacitive switch device includes an operation panel operated by a user with a touch operation, a film member provided along a surface of the operation panel on an opposite side from a surface operated with the touch operation, and an electrode portion forming a capacitor with a finger of the user and a wiring portion, both the electrode portion and the wiring portion being provided to the film member. The film member is bonded to the operation panel by a pressure-sensitive adhesive at a predetermined first portion of the film member and supported at a second portion of the film member different from the first portion by a supporting portion which allows the film member to move due to thermal expansion and thermal contraction in an in-plane direction of the film member.

8 Claims, 5 Drawing Sheets

(58) Field of Classification Search
USPC .......................................................... 200/600
See application file for complete search history.

(56) References Cited

U.S. PATENT DOCUMENTS

2013/0194029 A1    8/2013   Hisatsugu
2014/0085213 A1*   3/2014   Huppi .................. G06F 3/0414
                                                345/173

FOREIGN PATENT DOCUMENTS

| JP | 2013157142 A | 8/2013 |
|----|--------------|--------|
| JP | 2014160542 A | 9/2014 |

* cited by examiner

CAPACITIVE SWITCH DEVICE

CROSS REFERENCE TO RELATED APPLICATION

This application is a U.S. National Phase Application under 35 U.S.C. 371 of International Application No. PCT/JP2016/002096 filed on Apr. 19, 2016 and published in Japanese as WO 2016/185669 A1 on Nov. 24, 2016. This application is based on and claims the benefit of priority from Japanese Patent Application No. 2015-102039 filed on May 19, 2015. The entire disclosures of all of the above applications are incorporated herein by reference.

TECHNICAL FIELD

The present disclosure relates to a capacitive switch device through which an operating condition is inputted into a predetermined device by a user with a touch operation.

BACKGROUND ART

A capacitive switch device in the related art is described in, for example, Patent Literature 1. A switch device of Patent Literature 1 includes a plate-shaped operation panel (dielectric material) operated by a user with a finger, and a film (PET film) provided with an electrode portion (switch electrode). The film is bonded to the operation panel with a pressure-sensitive adhesive, for example, a double-faced adhesive tape. Patent Literature 1 describes a case where the double-faced adhesive tape is provided across the entire film.

In the switch device of Patent Literature 1, when the user moves a finger closer to the operation panel, a capacitance generated between the finger and the electrode portion varies, and a variance in capacitance enables an operation to input an ON or OFF instruction or the like into a predetermined device. When the double-faced adhesive tape is applied across the entire film and bonded to the operation panel as in Patent Literature 1, a bonding area of the double-faced adhesive tape is increased, which increases costs of the double-faced adhesive tape (bonding member). In addition, a time (man-hours) required for a bonding work increases as the bonding area becomes larger.

PRIOR ART LITERATURE

Patent Literature

Patent Literature 1: JP 2008-141329 A

SUMMARY

The film may be bonded to the operation panel partially at two positions, such as opposite ends of the film.

However, when the film is bonded partially, the operation panel and the film may expand and contract differently in response to a temperature change due to a difference in linear expansion coefficient and a difference in glass transition point (Tg point), and corrugated creases may be generated in the film, for example, and lifting may occur between the operation panel and the film.

For example, when a linear expansion coefficient of the film is smaller than a linear expansion coefficient of the operation panel, the operation panel expands as a temperature rises while the film bonded to the operation panel at two positions becomes hot and soft and is stretched more than its linear expansion rate. When the operation panel contracts in response to a temperature fall, the film contracts only by an amount of linear expansion of itself. Thus, the expanded film is not restored to an original size. In such a case, the film may become slack like corrugated creases and lifting may occur. When such lifting occurs, a distance between the operation panel and the electrode portion may vary and sensitivity of the electrode portion is likely to deteriorate.

In view of the foregoing inconveniences, an object of the present disclosure is to provide a capacitive switch device capable of restricting an occurrence of lifting of a film in response to a temperature change.

According to an aspect of the present disclosure, a capacitive switch device includes: an operation panel operated by a user with a touch operation; a film member provided along a surface of the operation panel on an opposite side from a surface operated with the touch operation; an electrode portion forming a capacitor with a finger of the user, and a wiring portion for the electrode portion, both the electrode portion and the wiring portion being provided to the film member; a pressure-sensitive adhesive being provided between a predetermined first portion of the film member and the operation panel and bonding the film member to the operation panel; and a supporting portion supporting a second portion of the film member different from the first portion and allowing the film member to move due to thermal expansion and thermal contraction in an in-plane direction of the film member.

According to the present disclosure, the first portion of the film member is bonded to the operation panel by the pressure-sensitive adhesive while the second portion of the film member is supported by the supporting portion in such a manner that the second portion of the film member is allowed to move due to thermal expansion and thermal contraction.

Owing to the configuration as above, when the film member undergoes a temperature change, the film member is allowed to thermally expand and thermally contract independently from the operation panel in the second portion while the first portion is bonded to the operation panel. Hence, creases formed due to a difference in expansion and contraction between the operation panel and the film member can be eliminated. Consequently, an occurrence of lifting of the film member in response to a temperature change can be eliminated.

DESCRIPTION OF EMBODIMENTS

Figure 1:
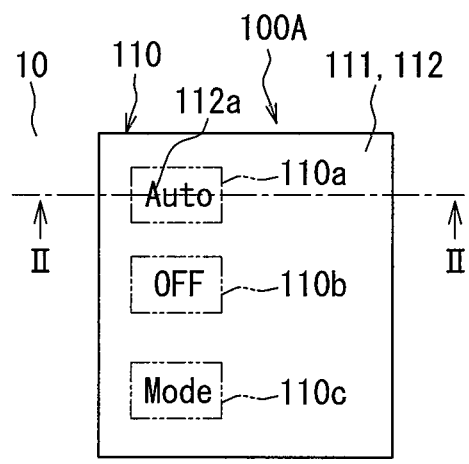
FIG. 1 is a front view of a capacitive switch device according to a first embodiment of the present disclosure.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A first embodiment of the present disclosure will be described using FIG. 1 through FIG. 3. A capacitive switch device (hereinafter, referred to simply as the switch device) 100A of the present embodiment is used to input an operating condition into an air-conditioning device as an example of a predetermined device equipped to a vehicle. The switch device 100A includes an input portion 110, a substrate 120, a connector 130, a detection IC 140, an illumination LED 150, and so on.

The input portion 110 is a portion through which a driver (user) inputs an operating condition into the air-conditioning device by an operation with a finger. The input portion 110 is located at an easy-to-operate position for the driver in an instrument panel 10 of the vehicle. Phrases, "a finger operation" and "operation or operated with a finger", referred to herein mean an operation to touch any one of switches 110a through 110c described below with a finger, which corresponds to a touch operation of the present disclosure.

As is shown in FIG. 1, the input portion 110 includes multiple switches 110a, 110b, and 110c. The respective switches 110a through 110c form capacitive switch portions, and as is shown in FIG. 2, each is provided to overlap an operation panel 111, a decorative layer 112, a capacitive switch sheet 113, a double-faced adhesive tape 114, a supporting portion 115, and so on in a plate thickness direction of the operation panel 111.

The respective switches 110a through 110c are switches to set an operating condition of the air-conditioning device, for example, the automatic (Auto) switch 110a to set an automatic control, the air blower OFF switch (OFF) 110b to turn OFF an air blower, and the mode (Mode) switch 110c to set a blow mode.

The operation panel 111 is a plate member as a base of a finger operation. For example, the operation panel 111 is a member of a flat plate shape conforming to a design shape along an outer shape and made of a light-transmitting resin material.

The decorative layer 112 is formed of a coating film, a printed film, transfer foil, or the like and provided to the operation panel 111 on a surface facing the driver (main surface). A region of the decorative film 112 surrounding the respective switches 110a through 110c forms a background portion, and regions corresponding to the respective switches 110a through 110c form design portions 112a showing switch functions. For example, the design portions 112a are made up of characters and show "Auto", "OFF", "Mode", and so on as described above. The background portion of the decorative layer 112 is a light-shielding region whereas the design portions 112a are light-transmitting regions.

Figure 2:
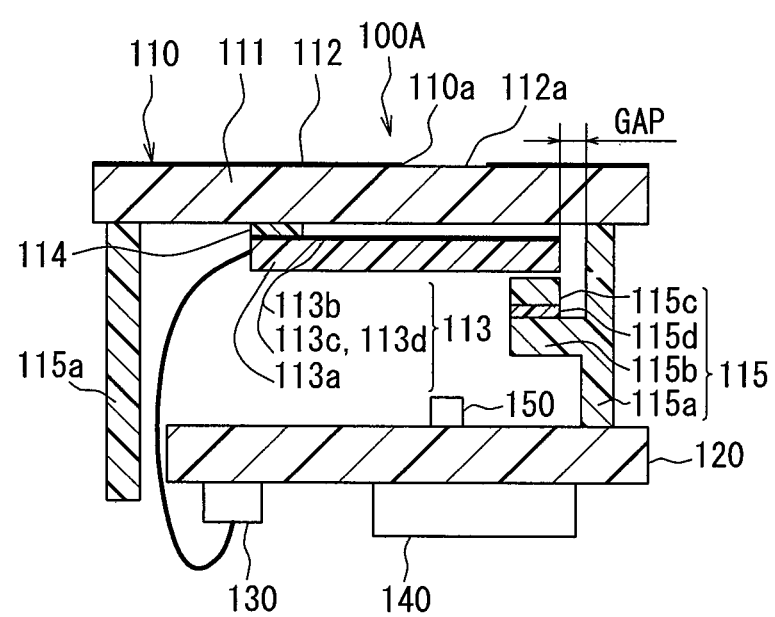
FIG. 2 is a sectional view taken along the line II-II of FIG. 1.
Figure 3:
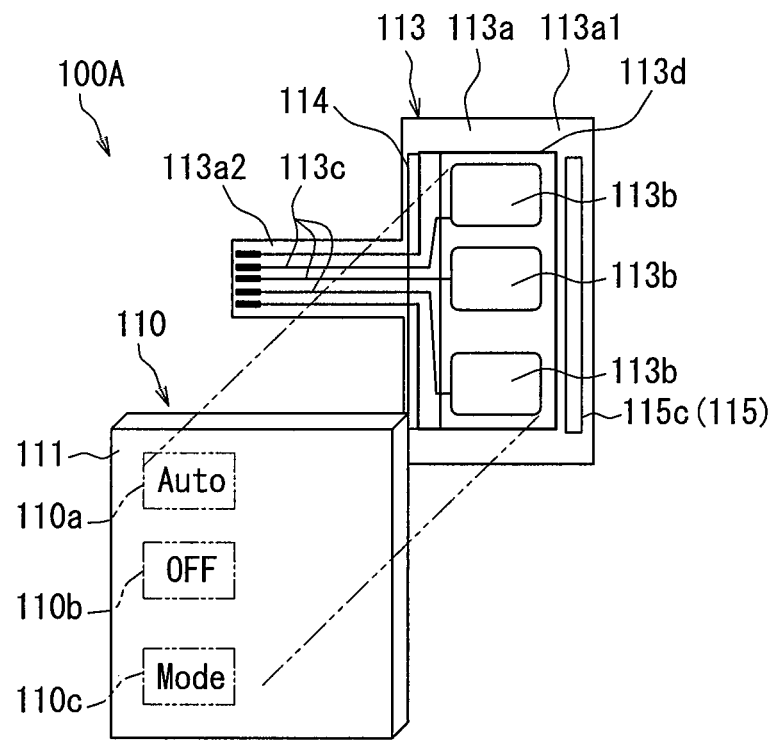
FIG. 3 is a schematic view of an operation panel and an electrostatic switch sheet of the first embodiment.

As are shown in FIG. 2 and FIG. 3, the electrostatic switch sheet 113 is provided along a surface (hereinafter, referred to as the back surface) of the operation panel 111 on an opposite side from a surface operated by a finger. The electrostatic switch sheet 113 includes a base film 113a (film member) which is patterned into an electrode portion 113b, wiring portions 113c and 113d, and so on by printing or the like.

The base film 113a is a thin-film member made of a resin material, for example, polyethylene terephthalate or polyimide, and disposed along the back surface of the operation panel 111. The base film 113a has, for example, a main body portion 113a1 of a vertically-long rectangular shape having long sides in a direction (longitudinal direction) in which the respective switches 110a through 110c are aligned side by side, and a band portion 113a2 protruding in a band shape from a center of one long side of the main body portion 113a1 in a direction orthogonal to the long side. The main body portion 113a1 and the band portion 113a2 are formed integrally and shaped like a capital T as a whole.

The electrode portion 113b forms a capacitor with a finger of the driver via the operation panel 111 during a finger operation. The electrode portion 113b is printed on the main body portion 113a1 of the base film 113a on a surface on a side of the operation panel 111 by a printing material (ink or paste) or the like including metal foil and a conductive substance (carbon, metal, conductive polymer, and so on). The base film 113a includes multiple (three, herein) electrode portions 113b, which are provided to the base film 113a to correspond to (overlap) positions of the design portions 112a of the respective switches 110a through 110c.

The wiring portions 113c are electrode portions wiring to transmit signals (signals relating to a capacitance) outputted from the electrode portion 113b, and are connected to the respective electrode portions 113b at one ends. One wiring portion 113c is prepared for each electrode portion 113b. Hence, the wiring portion 113c is provided to make a pair with each electrode portion 113b. As with the electrode portions 113b, the wiring portions 113c are printed on the main body portion 113a1 and the band portion 113a2 of the base film 113a on surfaces on the side of the operation panel 111 by a printing material (ink or paste) or the like including, for example, metal foil, a conductive substance (carbon, metal, a conductive polymer, and so on). The other ends of the wiring portions 113c are connected to the connector 130 described below.

The wiring portion 113d is an electrode portion wiring provided to surround the respective electrode portions 113b. As with the wiring portions 113c, the wiring portion 113d is printed on the main body portion 113a1 and the band portion 113a2 of the base film 113a on the surfaces on the side of the operation panel 111 by a printing material (ink or paste) or the like including, for example, metal foil, a conductive substance (carbon, metal, a conductive polymer, and so on). An end of the wiring portion 113d is connected to a ground.

The double-faced adhesive tape 114 is an example of a pressure-sensitive adhesive to bond the base film 113a (electrostatic switch sheet 113) described above to the operation panel 111. The double-faced adhesive tape 114 is a long and narrow tape and provided to the base film 113a at a predetermined first portion where one pressure-sensitive adhesive face is bonded to the surface of the base film 113a where the electrode portions 113b are provided. The first portion is located along the long side of the main body portion 113a1 on one side (hereinafter, referred to as the one-end portion). The base film 113a is bonded to the operation panel 111 by the other pressure-sensitive adhesive face of the double-faced adhesive tape 114.

A gap large enough to absorb thermal expansion of the base film 113a is provided between an end of the base film 113a on the other side and a wall portion 115a of the support portion 115 described below. With own rigidity, the base film 113a maintains a posture along the operation panel 111 with a fine gap comparable to a thickness dimension of the double-faced adhesive tape 114 from the operation panel 111.

The supporting portion 115 is a portion supporting the operation panel 111 while allowing the base film 113a to move due to thermal expansion and thermal contraction in an in-plane direction of the base film 113a at a second portion of the base film 113a different from the first portion. The second portion is located along the long side of the main body 113a1 on the other side (hereinafter, referred to as the other-end portion).

The supporting portion 115 has the wall portion 115a extending toward the substrate 120 described below from the surface of the operation panel 111 opposite to the surface operated with a finger, an arm portion 115b extending from a midpoint of the wall portion 115a in a direction in which the surfaces of the operation panel 111 spread, a flexible soft member 115c, a double-faced adhesive tape 115d, and so on. The soft member 115c is a long and narrow member of a rectangular shape in cross section and provided along the other-end portion of the main body 113a1. The soft member 115c is made of, for example, urethane foam or a rubber material and bonded to a surface of the arm portion 115b on a side of the operation panel 111 with the double-faced adhesive tape 115d. A surface (hereinafter, referred to as the tip-end surface) of the soft member 115c opposite to the bonded surface faces the base film 113a.

A fine gap is provided between the tip-end surface of the soft member 115c and the base film 113a and the fine gap allows the base film 113a to move due to thermal expansion and thermal contraction in the in-plane direction as described above. The supporting portion 115 maintains the base film 113a in a posture along the surfaces of the operation panel 111 by preventing a change in posture caused when the base film 113a protrudes toward the soft member 115c for some reason.

The substrate 120 is a thin plate member provided with an electrical circuit on a main surface, and disposed parallel to the operation panel 111 on a side opposite to the surface of the operation panel 111 operated with a finger. The substrate 120 is fixed to the wall portion 115a.

The connector 130 forms connection portions to the respective wiring portions 113c and 113d. The connector 130 includes multiple connectors 130 disposed to the substrate 120 on a surface on an opposite side to the operation panel 111 in a one-to-one correspondence with the respective wiring portions 113c and 113d.

The detection IC 140 is a detection portion connected to the respective connectors 130 to detect signals from the respective electrode portions 113b. Herein, the single detection IC 140 is provided for the multiple electrode portions 113b. The detection IC 140 is provided to the substrate 120 on the surface on the opposite side to the operation panel 111. The detection IC 140 detects signals from all the electrode portions 113b by detecting signals from the respective electrode portions 113b one by one at predetermined minimal time intervals.

Each electrode portion 113b generates a capacitance Ch with a finger of the driver. Likewise, each electrode portion 113b generates a capacitance Cam with a nearby conductor and generates a capacitance Cg with the ground (earth). Let Cx be a sum of the capacitances Ch, Cam, and Cg, then the detection IC 140 detects a sum of the capacitances, Cx, as signals from the respective electrode portions 113b.

The illumination LED 150 is a light source from which light is irradiated to the respective design portions 112a corresponding to the respective electrode portions 113b. The illumination LED 150 includes multiple (three, herein) illumination LEDs 150 to correspond to the respective design portions 112a. The illumination LEDs 150 are provided to the substrate 120 on a surface opposing the operation panel 111. When the respective illumination LEDs 150 are lit ON, the corresponding design portions 112a are illuminated brightly.

An operation and a functional effect of the switch device 100A configured as above will now be described.

When the driver operates the air-conditioning device while a vehicle is stopped or moving by touching a desired switch (one of the switches 110a through 110c) with a finger, a capacitor is formed between the finger, which is a conductive operation body, and the electrode portion 113b corresponding to the position of the switch (for example, the switch 110c) touched by the finger, and a charging phenomenon takes place. The detection IC 140 detects a variance in capacitance with the charging as a signal via the wiring portions 113c and 113d and the connectors 130. The detection IC 140 converts the detected signal into a signal of a predetermined format, which is outputted to the air-conditioning device (air-conditioning control portion).

The air-conditioning control portion switches operating conditions of the air-conditioning device according to the outputted signal. The driver is thus able to change (input) the operating condition of the air-conditioning device by operating the respective switches 110a through 110c with a finger as described above.

In the present embodiment, the one-end portion (first portion) of the base film 113a is bonded to the operation panel 111 with the double-faced adhesive tape 114 while the other-end portion (second portion) of the base film 113a is supported by the supporting portion 115 in such a manner that the other-end portion of the base film 113a is allowed to move due to thermal expansion and thermal contraction.

Hence, when the base film 113a undergoes a temperature change, the other-end portion of the base film 113a is allowed to thermally expand and thermally contract independently of the operation panel 111 with the bonded one-end portion set as an origin. Hence, crinkles formed due to a difference in expansion and contraction between the operation panel 111 and the base film 113a can be eliminated. Consequently, an occurrence of lifting of the base film 113a in response to a temperature change can be eliminated.

The double-faced adhesive tape 114 is bonded to the base film 113a not entirely but at the one-end portion alone. Hence, a necessary area of the double-faced adhesive tape 114 can be reduced. Consequently, costs of the double-faced adhesive tape 114 can be reduced and a time (man-hours) required for a bonding work can be reduced.

Second Embodiment

Figure 4:
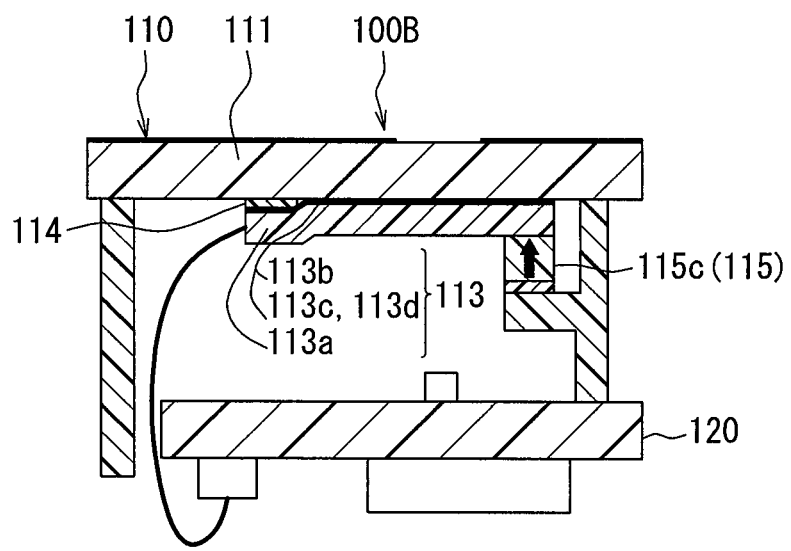
FIG. 4 is a sectional view of a capacitive switch device according to a second embodiment of the present disclosure.

A switch device 100B of a second embodiment is shown in FIG. 4. The switch device 100B of the second embodiment is different from the switch device 100A of the first embodiment above in that a soft member 115c pushes an other-end portion of a base film 113a toward an operation panel 111. An arrow of FIG. 4 indicates a pushing direction.

A tip-end surface of the soft member 115c is in contact with a surface of the base film 113a on a side of a substrate 120 and applies a predetermined pushing force to the base film 113a toward the operation panel 111. No gap or a fine gap is provided between the operation panel 111 and an electrode portion 113b and the base film 113a is maintained in a posture along surfaces of the operation panel 111. Even under a pushing force applied by the soft member 115c, the base film 113a is allowed to move due to thermal expansion and thermal contraction in an in-plane direction of the base film 113a in a same manner as in the first embodiment above. To be more exact, the base film 113a has a step comparable to a thickness dimension of a double-faced adhesive tape 114 between a region of the double-faced adhesive tape 114 and the other region.

Owing to the configuration as above, the base film 113a is allowed to thermally expand and thermally contract independently of the operation panel 111 in the same manner as in the first embodiment above. Hence, crinkles formed due to a difference in expansion and contraction between the operation panel 111 and the base film 113a can be eliminated. Consequently, an occurrence of lifting of the base film 113a in response to a temperature change can be eliminated.

In the present embodiment, the base film 113a pushed by the soft member 115c is maintained in a posture along the in-plane direction of the operation panel 111 in a reliable manner.

Third Embodiment

Figure 5:
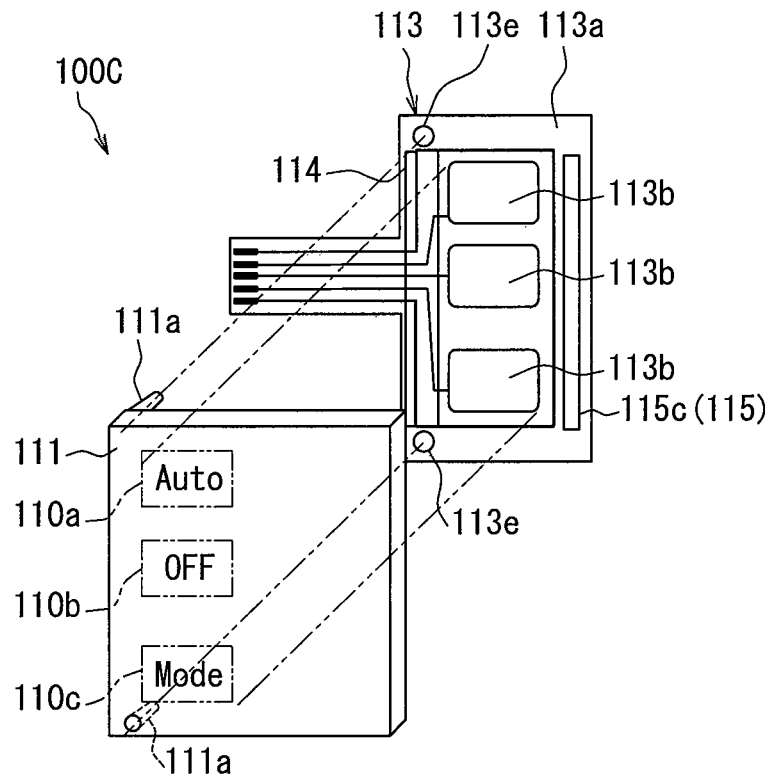
FIG. 5 is a schematic view of an operation panel and an electrostatic switch sheet according to a third embodiment of the present disclosure.

A switch device 100C of a third embodiment is shown in FIG. 5. The switch device 100C of the third embodiment is different from the switch devices 100A and 100B of the first and second embodiments above in that a positioning portion which fixes a position of a base film 113a with respect to an operation panel 111 is additionally provided.

The positioning portion is provided to the operation panel 111 and has a rod-shaped positioning pin 111a extending toward the base film 113a and a positioning hole 113e provided to the base film 113a to let the positioning pin 111a pass through.

The positioning pin 111a and the positioning hole 113e are provided to correspond to a region where a double-faced adhesive tape 114 is provided. More specifically, the positioning pin 111a and the positioning hole 113e are provided in portions (two portions) located at both ends of the double-faced adhesive tape 114 in a longitudinal direction.

Owing to the configuration as above, the operation panel 111 and the base film 113a can be combined after the both are positioned with respect to each other by inserting the respective positioning pins 111a into the corresponding positioning holes 113e when the base film 113a is bonded to the operation panel 111 with the double-faced adhesive tape 114 provided to the base film 113a. Consequently, the operation panel 111 and the base film 113a can be positioned exactly with respect to each other.

In the present embodiment, the base film 113a is positioned and fixed to the operation panel 111 by the positioning pins 111a and the positioning holes 113e. It should be noted, however, that the positioning pins 111a and the positioning holes 113e are provided to portions corresponding to a region (one-end portion) where the double-faced adhesive tape 114 is provided. Hence, an other-end portion of the base film 113a is allowed to move due to thermal expansion and thermal contraction in a same manner as in the first and second embodiments above. Consequently, an occurrence of lifting of the base film 113a in response to a temperature change can be eliminated.

Fourth Embodiment

Figure 6:
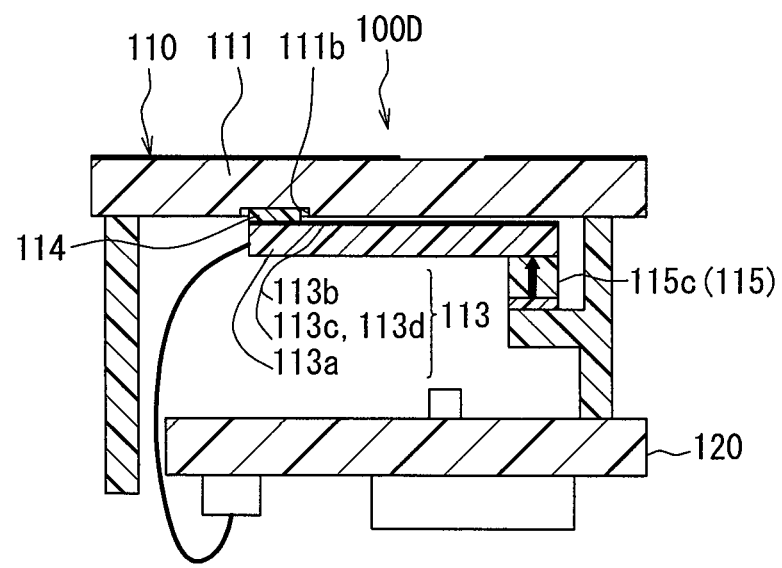
FIG. 6 is a sectional view of a capacitive switch device according to a fourth embodiment of the present disclosure.

A switch device 100D of a fourth embodiment is shown in FIG. 6. The switch device 100D of the fourth embodiment is different from the switch devices 100A through 100C of the first through third embodiments above in that a recess portion 111b is provided to an operation panel 111 at a position corresponding to a double-faced adhesive tape 114.

The recess portion 111b is a recess having a depth comparable to a thickness dimension of the double-faced adhesive tape 114. A depth dimension of the recess portion 111b is set to be slightly less than the thickness dimension of the double-faced adhesive tape 114 to an extent that no gap or a fine gap is provided between the operation panel 111 and an electrode portion 113b.

Owing to the configuration as above, a distance between the operation panel 111 and the electrode portion 113b can be shortened by the thickness dimension of the double-faced adhesive tape 114. Hence, sensitivity of the electrode portion 113b can be enhanced. In addition, a step of the base film 113a as described in the second embodiment above can be eliminated.

Fifth Embodiment

Figures 7, 8:
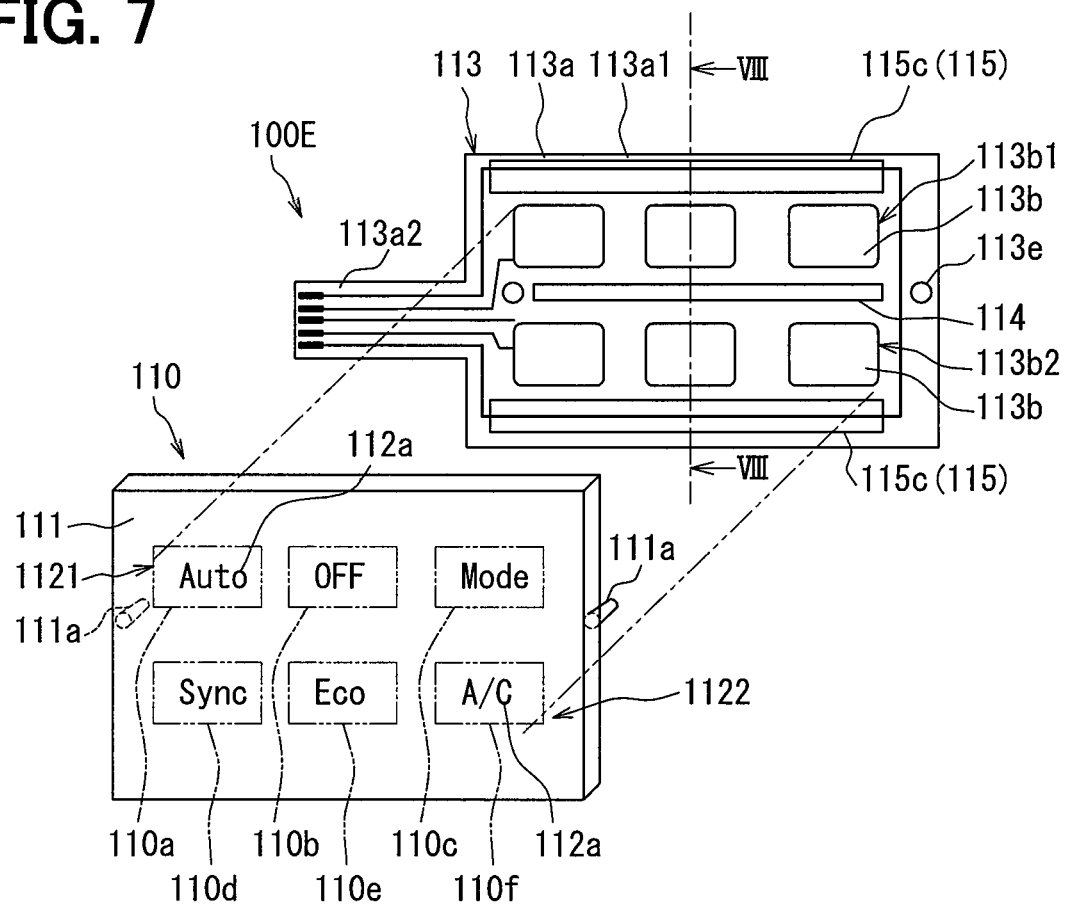
FIG. 7 is a schematic view of an operation panel and an electrostatic switch sheet according to a fifth embodiment of the present disclosure.
FIG. 8 is a sectional view taken along the line VIII-VIII of FIG. 7.

A switch device 100E of a fifth embodiment is shown in FIG. 7 and FIG. 8. The switch device 100E of the fifth embodiment is different from the switch devices 100A through 100D of the first through fourth embodiments above in that more switches 110a through 110f are provided and multiple design portions 112a of different types are provided. In addition, a base film 113a is provided with a first electrode portion group 113b1 corresponding to a part of the multiple design portions 112a and a second electrode portion group 113b2 corresponding to a rest of the multiple design portions 112a.

An operation panel 111 is of a horizontally-long rectangular shape and the respective switches 110a through 110f are aligned in two rows, namely, upper and lower rows. Of the respective switches 110a through 110f, the switches 110a through 110c aligned in the upper row are the automatic switch 110a, the air blower OFF switch 110b, and the mode switch 110c, respectively, as described in the embodiments above, which are switches provided with the design portions 112a forming a first design portion group 1121.

Of the respective switches 110a through 110f, the switches 110d through 110f aligned in the lower row are, for example, the synchronization (Sync) switch 110d to synchronize an operating condition on a passenger's seat side with an operating condition on a driver's seat side in a right-left independently operated air-conditioning device, the economy (Eco) switch 110e to control the air-conditioning device to operate in an economy mode, and the air conditioning (A/C) switch 110f to turn ON and OFF the air-conditioning device (compressor), respectively. The respective switches 110d through 110f are switches provided with the design portions 112a forming a second design portion group 1122.

A main body portion 113a1 of the base film 113a is of a horizontally-long rectangular shape in conforming to the operation panel 111. Multiple (six, herein) electrode portions 113b are aligned in two rows, namely, upper and lower rows on the base film 113a at positions corresponding to (superposing on) the design portions 112a of the respective switches 110a through 110f.

Upper three electrode portions 113b are provided to correspond to the respective design portions 112a in the first design portion group 1121 and form the first electrode portion group 113b1. Likewise, lower three electrode portions 113b are provided to correspond to the respective design portions 112a in the second design portion group 1122 and form the second electrode portion group 113b2.

A double-faced adhesive tape 114 is disposed on the base film 113a at a position corresponding to a space between the first electrode portion group 113b1 and the second electrode portion group 113b2. That is, the double-faced adhesive tape 114 is disposed on the base film 113a between the three electrode portions 113b in the upper row and the three electrode portions 113b in the lower row.

A recess portion 111b same as the counterpart of the fourth embodiment above is provided to the operation panel 111 at a position corresponding to the double-faced adhesive tape 114. A depth dimension of the recess portion 111b is set to be slightly less than a thickness dimension of the double-faced adhesive tape 114 to an extent that no gap or a fine gap is provided between the operation panel 111 and the electrode portion 113b.

Further, supporting portions 115 are disposed at positions corresponding, respectively, to two parts of the base film 113a between which the first electrode portion group 113b1 and the second electrode portion group 113b2 are placed. That is, one supporting portion 115 is disposed such that the first electrode portion group 113b1 is placed between the one supporting portion 115 and the double-faced adhesive tape 114. Another supporting portion 115 is disposed such that the second electrode portion group 113b2 is placed between the other supporting portion 115 and the double-faced adhesive tape 114. As is indicated by thick arrows of FIG. 8, soft members 115c of the respective supporting portions 115 support the base film 113a to apply a pushing force to the base film 113a.

Positioning pins 111a and positioning holes 113e are provided to regions corresponding to the double-faced adhesive tape 114, that is, at both ends of the double-faced adhesive tape 114 in a longitudinal direction.

Owing to the configuration as above, the base film 113a in a region corresponding to the first electrode portion group 113b1 is allowed to thermally expand and thermally contract independently of the operation panel 111 on a side of the upper supporting portion 115 with the position of the double-faced adhesive tape 114 set as an origin. Likewise, the base film 113a in a region corresponding to the second electrode portion group 113b2 is allowed to thermally expand and thermally contract independently of the operation panel 111 on a side of the lower supporting portion 115 with the position of the double-faced adhesive tape 114 set as the origin.

Hence, even in a case where the base film 113a is provided with multiple electrode portions 113b aligned in multiple rows, an occurrence of lifting of the base film 113a in response to a temperature change can be eliminated.

Sixth Embodiment

Figure 9:
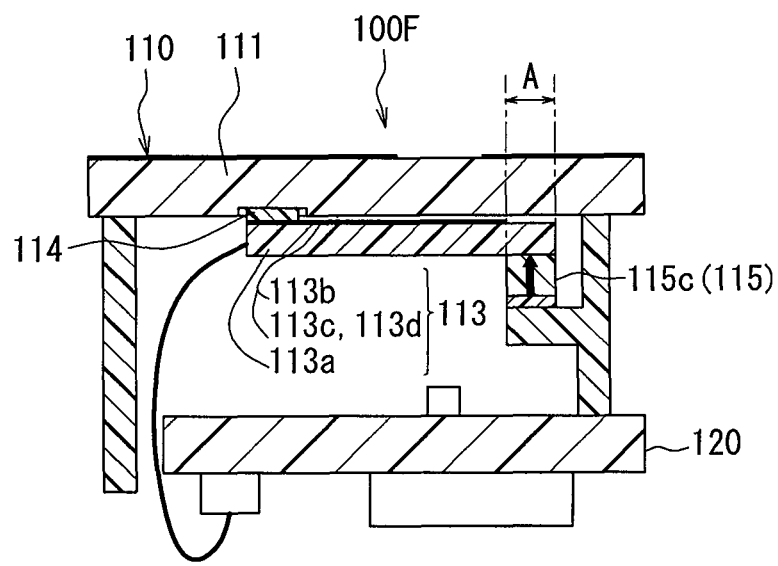
FIG. 9 is a sectional view of a capacitive switch device according to a sixth embodiment of the present disclosure.

A switch device 100F of a sixth embodiment is shown in FIG. 9. The switch device 100F of the sixth embodiment is different from the switch devices 100A through 100E of the first through fifth embodiments above in that electrode portions 113b and wiring portions 113c and 113d are provided to a limited region on a base film 113a.

As is indicated by a thick arrow of FIG. 9, the base film 113a is pushed toward an operation panel 111 by a soft member 115c of a supporting portion 115. The electrode portions 113b and the wiring portions 113c and 113d are provided to the base film 113a on a surface on a side of the operation panel 111. The electrode portions 113b and the wiring portions 113c and 113d are provided in a region on the base film 113a other than a region (indicated by a capital A of FIG. 9) corresponding to the soft member 115c.

Owing to the configuration as above, an inconvenience that the electrode portions 113b and the wiring portions 113c and 113d become hot and stick to the operation panel 111 due to a pushing force of the soft member 115c can be restricted.

Seventh Embodiment

Figure 10:
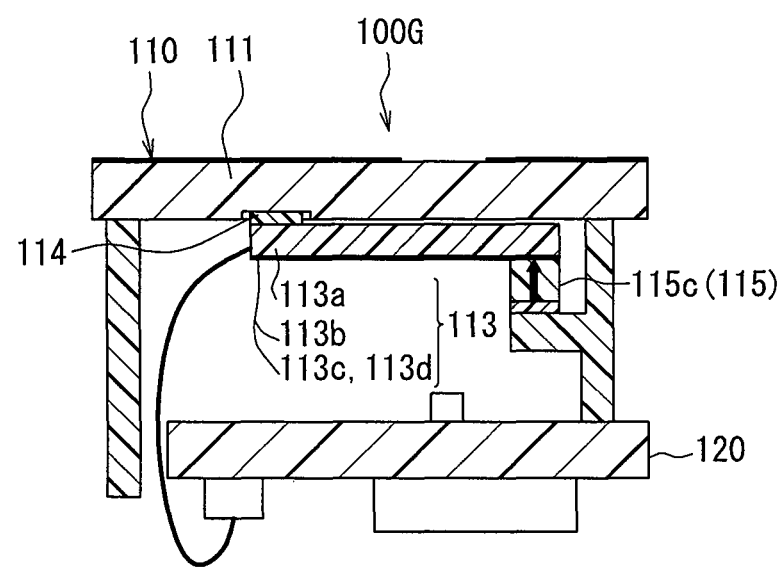
FIG. 10 is a sectional view of a capacitive switch device according to a seventh embodiment of the present disclosure.

A switch device 100G of a seventh embodiment is shown in FIG. 10. The switch device 100G of the seventh embodiment is different from the switch devices 100A through 100F of the first through sixth embodiments above in locations of electrode portions 113b and wiring portions 113c and 113d on a base film 113a.

The electrode portion 113b and the wiring portions 113c and 113d are provided on a surface of the base film 113a facing away from an operation panel 111. Hence, as with the sixth embodiment above, an inconvenience that the electrode portions 113b and the wiring portions 113c and 113d become hot and stick to the operation panel 111 due to a pushing force of a soft member 115c indicated by a thick arrow of FIG. 10 can be restricted.

The respective embodiments above have described a case where the double-faced adhesive tape 114 is used as a pressure-sensitive adhesive. However, the present disclosure is not limited to the configuration as above and other bonding members (adhesive, thermal caulking, welding, and so on) are also available.

The respective embodiments above have described cases using three or six design portions 112a and three or six electrode portions 113b. However, display contents and types of the design portions 112a and the number of the electrode portions 113b corresponding to the respective design portions 112a are not limited to the contents, the types, and the number specified above.

The above has described a case where the respective switch devices 100A through 100G are a switch device of an air-conditioning device. However, the present disclosure is not limited to the configuration as above and the present disclosure have a wide application and can be used also as a switch device of a car navigation device, an audio device and the like.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A capacitive switch device, comprising:
   an operation panel operated by a user with a touch operation;

a film member provided along a surface of the operation panel on an opposite side from a surface operated with the touch operation;

an electrode portion forming a capacitor with a finger of the user, and a wiring portion for the electrode portion, both the electrode portion and the wiring portion being provided to the film member;

a pressure-sensitive adhesive being provided between a predetermined first portion of the film member and the operation panel and bonding the film member to the operation panel; and a supporting portion supporting a second portion of the film member different from the first portion and allowing the film member to move due to thermal expansion and thermal contraction in an in-plane direction of the film member, wherein the first portion is different in position from the second portion in the in-plane direction of the film member.

2. The capacitive switch device according to claim 1, wherein the supporting portion includes a flexible soft member having flexibility and supports the second portion of the film member by the soft member pushing the second portion of the film member toward the operation panel.

3. The capacitive switch device according to claim 1, further comprising a positioning portion fixing a position of the film member with respect to the operation panel, wherein
the positioning portion is disposed to correspond to a region where the pressure-sensitive adhesive is provided.

4. The capacitive switch device according to claim 1, wherein the operation panel has a recess portion in a region corresponding to the pressure-sensitive adhesive, the recess portion having a depth corresponding to a thickness of the pressure-sensitive adhesive.

5. The capacitive switch device according to claim 1, further comprising a plurality of design portions of different types provided to the operation panel, wherein:
the film member is provided with a first electrode portion group having a plurality of electrode portions of the electrode portion corresponding to a part of the plurality of the design portions, and a second electrode portion group having another plurality of electrode portions of the electrode portion corresponding to another part of the plurality of the design portions;

the pressure-sensitive adhesive is disposed to the film member in a portion corresponding to a space between the first electrode portion group and the second electrode portion group; and the supporting portion includes two supporting portions disposed at positions corresponding, respectively, to two parts of the film member between which the first electrode portion group and the second electrode portion group are placed.

6. The capacitive switch device according to claim 1, wherein the electrode portion and the wiring portion are provided in a region on a surface of the film member facing the operation panel other than a region corresponding to the supporting portion.

7. The capacitive switch device according to claim 1, wherein the electrode portion and the wiring portion are provided on a surface of the film member facing away from the operation panel.

8. A capacitive switch device, comprising:
an operation panel operated by a user with a touch operation;

a film member provided along a surface of the operation panel on an opposite side from a surface operated with the touch operation;

an electrode portion forming a capacitor with a finger of the user, and a wiring portion for the electrode portion, both the electrode portion and the wiring portion being provided to the film member;

a pressure-sensitive adhesive being provided between a predetermined first portion of the film member and the operation panel and bonding the film member to the operation panel;

a supporting portion supporting a second portion of the film member different from the first portion and allowing the film member to move due to thermal expansion and thermal contraction in an in-plane direction of the film member; and wherein the operation panel has a recess portion in a region corresponding to the pressure-sensitive adhesive, the recess portion having a depth corresponding to a thickness of the pressure-sensitive adhesive.

* * * * *